INVENTORS
EDWIN R. RADER
ROBERT C. WEYRICK
BY
Oldham & Oldham
ATTORNEYS.

INVENTORS
EDWIN R. RADER
ROBERT C. WEYRICK
BY
Oldham & Oldham
ATTORNEYS.

United States Patent Office 3,460,052
Patented Aug. 5, 1969

3,460,052
OSCILLATOR PHASE AND FREQUENCY SYNCHRONIZING CIRCUIT

Edwin R. Rader, Tallmadge, and Robert C. Weyrick, Akron, Ohio, assignors to Information Development Corporation, Akron, Ohio Filed Aug. 2, 1967, Ser. No. 657,859
Int. Cl. H03b 3/04
U.S. Cl. 331—10 5 Claims

ABSTRACT OF THE DISCLOSURE

An electrical circuit adapted to synchronize the output of a voltage-controlled oscillator to any variable periodic function by simultaneously correcting both phase and frequency errors. The oscillator output waveform is electronically compared to discrete pulses generated once each time the periodic function passes a reference point to produce electrical signals that are proportional to phase error. The phase error voltage is applied to an oscillator control circuit so that the phase error is corrected during the succeeding oscillator period and the oscillator frequency is adjusted to cause successive phase errors to approach zero. The circuit can synchronize the oscillator to either the fundamental frequency of the periodic function or to any integral multiple of the periodic function through the tenth harmonic.

PRIOR ART

Heretofore there have been many techniques to achieve frequency synchronization for variable periodic functions. However, none of these prior art techniques have simultaneously combined both phase and frequency synchronization, in a simple, highly accurate, and inexpensive electronic circuitry arrangement.

OBJECTS OF THE INVENTION

The general object of the invention is to provide a variable speed synchronization circuit which corrects both the phase and frequency of an oscillator output simultaneously to any variable periodic function, which circuitry is simple, inexpensive, yet extremely accurate and highly effective.

DESCRIPTION OF THE DRAWINGS

For a better understanding of the invention, reference should be had to the accompanying drawings wherein.

DESCRIPTION OF THE INVENTION

Figure 1:
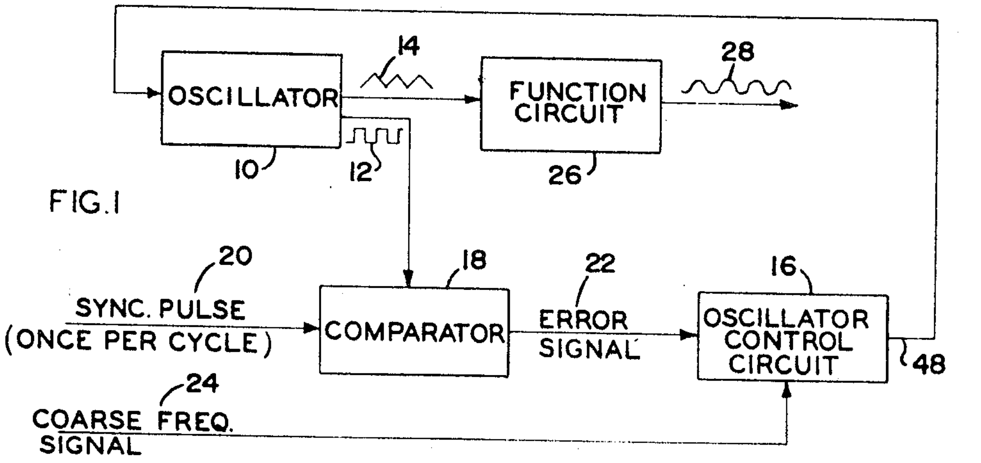
FIG. 1 is a block diagram schematic of the overall circuit necessary to achieve the desired synchronization.
Figure 2:
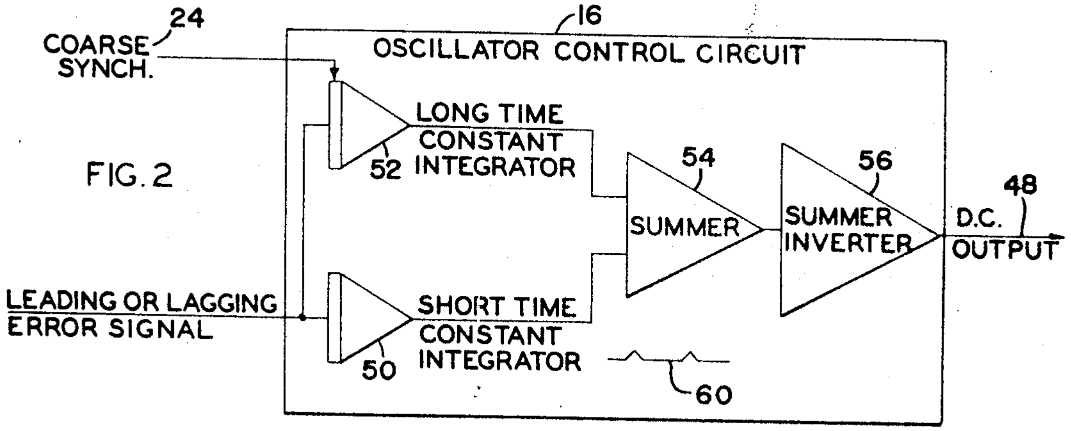
FIG. 2 is an enlarged electrical block diagram of the internal components of the oscillator control circuit.

With reference to the block diagram shown in FIG. 1, the numeral 10 indicates generally a variable frequency oscillator of conventional type adapted to produce a square-waveform output 12 and a triangular waveform output 14, both of the same frequency, and dependent upon an input signal from an oscillator control circuit 16. Essentially, the oscillator 10 is designed to be voltage controlled, and must be of a type wherein frequency can be varied by a signal from the control circuit 16. A typical voltage controlled oscillator which might be used in this situation is shown in FIGS. 9–13(*a*) on page 355 of a book, Electronic Analog and Hybrid Computers, by Granino A. Korn and Theresa M. Korn, published by McGraw-Hill Book Co., 1964.

Although the invention is described for synchronizing the oscillator frequency and phase to the frequency of the periodic input, it should be understood that the invention applies as well to synchronizing the oscillator frequency and phase to a harmonic multiple of the periodic input.

Synchronization is accomplished by feeding the square waveform 12 into a comparator 18 along with a sync pulse 20 which represents no more than a reference pulse from a variable periodic function. The sync pulse 20 is applied once per cycle of such periodic function. Naturally, the invention contemplates that many types of periodic functions could provide the sync pulse 20 as an input to comparator 18, and hence the invention is not limited to any particular periodic function. However, for the purposes of facilitating the description, the sync pulse is received from a variably rotating shaft, as will be explained more fully hereinbelow.

The comparator 18 then provides a comparison between the sync pulse 20 and the square waveform 12 from the oscillator 10 and provides an error signal 22 which is fed into the oscillator control circuit 16. In essence, the comparator 18 is a conventional piece of equipment which is adapted to compare the phase of the sync pulse with one of the edges of the square wave-form 12, and hence the error signal 22 is a time signal represented as leading or lagging so as to provide feedback corrections through the oscillator control circuit 16 to the oscillator 10 so that the output square waveform 12 therefrom may be simultaneously corrected to exact phase and frequency with the sync pulse 20.

In order to initialize the oscillator 10 to within a predetermined percentage of synchronization so that the feedback might be possible to fully implement synchronization at harmonic multiples of the periodic function, a coarse frequency signal 24 is initially fed into the control circuit 16, which signal 24 may come, for example, from a tachometer associated with the shaft from which the sync pulses 20 are generated. The triangular waveform 14 from the oscillator 10 which is of exactly the same frequency as the pulse 12 is fed into a conventional function circuit 26 which produces a well known sinusoidal waveform 28. Naturally, it should be understood that the sinusoidal waveform 28 is in exact synchronization both as to frequency and phase with sync pulse 20, and can be used in such synchronization for any selected purpose desired.

OPERATION OF A SPECIFIC SYSTEM

Figure 3:
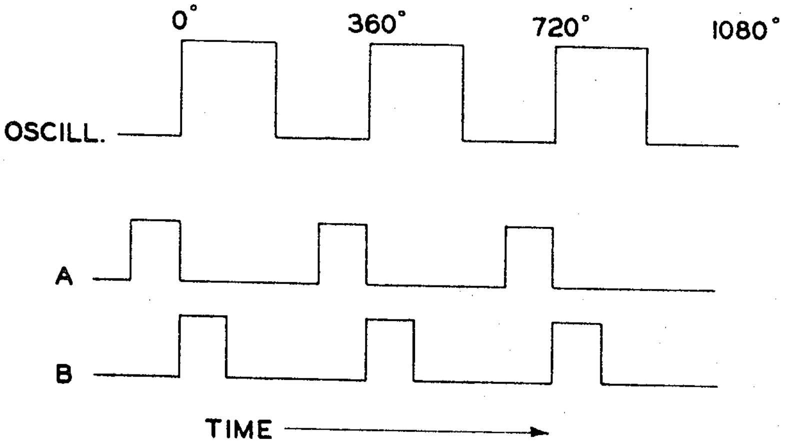
FIG. 3 is a graphic illustration of the oscillator output and the sync pulses all of which are in exact phase and synchronization, and which comprise the input pulses to the comparator of FIG. 1.
Figure 4:
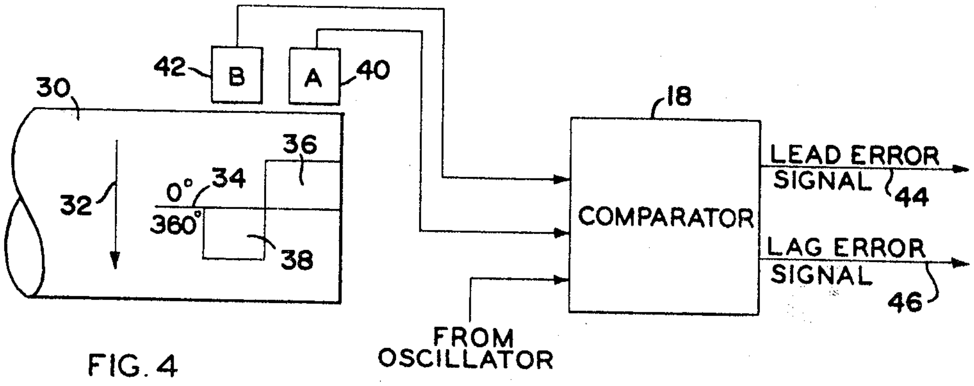
FIG. 4 illustrates schematically how the sync pulses are generated from a shaft rotating at variable speed to provide the phase information of the variable periodic input function.

For an understanding of the operation of a specific system, reference should be had to FIG. 4, which illustrates a shaft 30 rotating in a direction indicated by the arrow 32 and which has a variable speed of rotation. A reference line 34 is provided on the shaft 30 parallel to the axis thereof so that reference can be taken on this line. In essence, then the rotation of the shaft starting at this line 34 is at zero degrees and one full rotation is 360 degrees. Phase is determined by marking shaft 30 with longitudinally and angularly spaced patches 36 and 38, respectively, which can be detected by respective photocells 40 and 42, labeled A and B. In essence, the photocells A and B provide a square peaked pulse, such as that indicated in FIG. 3 when they view their respective patches, whereby the peaking of the A pulse occurs a certain number of degrees before the zero reference line and continues to exactly the zero reference line, and the B pulse commences at the zero reference line and continues approximately the same number of degrees past the zero reference line. It should then be understood that at exactly the zero reference there will not be either an A or B pulse present at that instant of time.

The signals from the A and B photocells are thus sent to the comparator 18 along with the square cyclical waveform from the oscillator 10 which is also indicated in enlarged form in FIG. 3. FIG. 3 illustrates the oscillator waveform in exact synchronization with waveforms A and B since the leading edge of the peak pulse occurs at exactly the same instant in time as the trailing edge of the A pulse and the leading edge of the B pulse. This represents the the necessary criteria for synchronization. However, such exact synchronization is rarely present if the rotational rate of the shaft 30 is varied at all.

Figure 5:
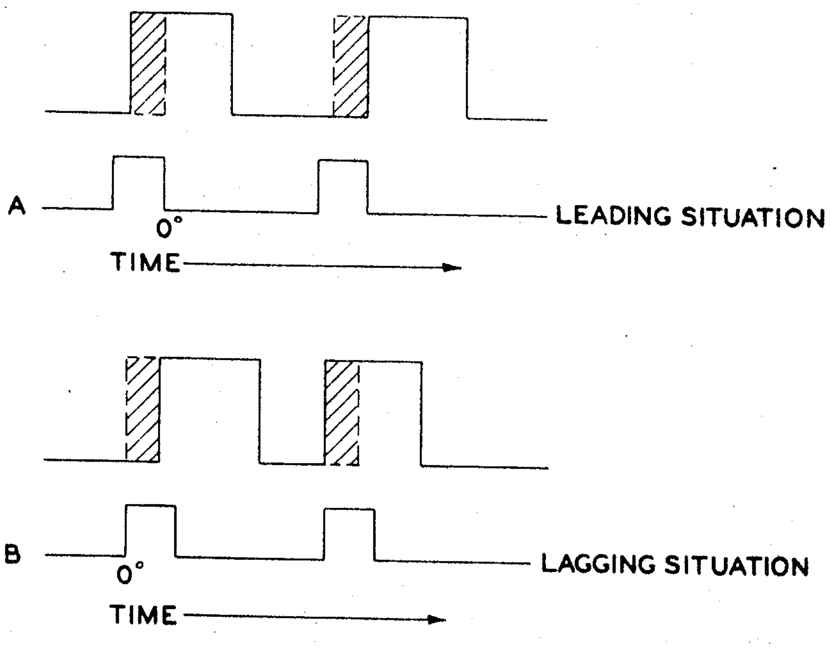
FIG. 5 is a graphic illustration of how the phase is corrected on the basis of comparison between either sync pulse and the leading edge of the square oscillator output signal.

FIG. 5 illustrates the function of the comparator 18 which is to determine when the leading edge of the squarewave pulse 12 from the oscillator 10 does not exactly coincide with the trailing edge of the pulse A and the leading edge of the pulse B. Hence, the upper half of FIG. 5 illustrates a leading situation where the leading edge of the pulse 12 occurs sometime during the duration of pulse A. Note that the zero reference point occurs at the trailing edge of the pulse A, and hence a time interval indicated by the shaded portion of waveform 12 represents the lead of the waveform 12 ahead of exact synchronization. This timing signal is represented as a lead error signal 44, as seen in FIG. 4, sent from the comparator 18 to the oscillator control circuit 16. The use of such error signal 44 in the circuit 16 to achieve a correction to the oscillator 10 will be described in greater detail below. However, in any event, what occurs is that the next leading edge of the pulse 12 is delayed the same time increment indicated by the shaded portion on the right of FIG. 5, so that the leading edge occurs in exact synchronization with the trailing edge of pulse A.

The converse situation is illustrated in the bottom half of FIG. 5 where the leading edge of waveform 12 occurs during pulse B indicating that the output from the oscillator 12 is lagging the actual rotational rate of the shaft 30, with the amount of lag being that time increment from the leading edge of pulse B to the leading edge of waveform 12, or indicated by the shaded portion to the left side of waveform 12. In this situation, in order to correct the phase relationship in the next cycle of the waveform 12, the leading edge must be advanced a similar increment of time indicated by the shaded portion to the right side of the waveform 12 so that this leading edge coincides with the leading edge of pulse B. This is a lagging situation, and the comparator 18 generates a lagging error signal 46 which is sent to control circuit 16 to achieve the desired correction to the square wave 12 output from the oscillator 10.

OSCILLATOR CONTROL CIRCUIT

With the leading or lagging signal information from the comparator 18, the oscillator control circuit generates a D.C. output signal 48 which corrects the output of the oscillator 10 so that output waveform 12 is in exact synchronization with the sync pulses 20. The control circuit 16 comprises an integrating circuit 50 having a relatively short time constant and a second integrating circuit 52 having a relatively long time constant, each of which receive the leading or lagging error signal as inputs thereto. Also, it should be noted that the coarse sync signal 24 is fed into only the long time constant integrator 52 to provide initial information to the oscillator 10. In any event, it should be understood that the integration time constant of the short time constant integrator 50 is significantly less than the time required for one rotation of the shaft 30 for all known or preconceived variations in the rotational rate thereof. The output of the short time constant integrator 50 is thus a series of sawtooth waveforms indicated by numeral 60. The amplitude of each waveform is proportional to the corresponding phase error between the rotating shaft and the output 12 of the oscillator 10. The time constant of the long time constant integrator 52 is equal to at least two cycles or complete rotations of the shaft 30 over its known or anticipated variable rotational range. The output of the integrator 52 therefore varies with the phase error averaged over a number of cycles which is a measure of the error in the rotational frequency.

The objects of the invention are achieved by summing the D.C. voltage outputs of the integrators 50 and 52 in a conventional summer 54. The summer output signal 48 is a D.C. voltage which is proportional to the frequency of the periodic function and which will gradually increase or decrease as the long time constant integrator 52 averages the phase error over a number of cycles. Superimposed on the D.C. level of the output signal 48 are periodic sawtooth perturbations from integrator 50 which are proportional to the phase error measured during a given cycle and which correct the oscillator frequency during its next cycle for such phase error. In terms recognizable to those skilled in the art, the oscillator control is a sampled-data circuit in which the phase error is measured or sampled once each cycle and the two integrators provide proportional and integral control signals to the voltage-controlled oscillator. Summer 54 serves to amplify and normally invert the polarity of the summation, as is recognized by those skilled in the art. Hence, a summer inverter 56 is necessary to insure that the corrective D.C. output signal 48 is of the proper polarity to move or adjust the phase of the output pulse 12 from the oscillator 10 in the right direction, as well as of the right amount. Naturally, the properties of the integrators 50 and 52, summer 54, and inverter 56 must be scaled to the requirements of the oscillator 10 so that the output signal 48 achieves the synchronization desired. The resulting signal level therefore controls the frequency of the pulse 12, as well as correcting for phase error, with both these functions being performed simultaneously by the circuitry of the oscillator control circuit 16.

The angular width of the phase detecting pulses A and B, generated in this instance by the photocells 40 and 42 picking up the patches 36 and 38, must be controlled in width in order that the oscillator be synchronized at harmonics of the periodic input frequency. In practicing the invention, it has been found that great accuracy up to the tenth harmonic of the rotating frequency can be obtained by making these marking areas 36 and 38 each approximately 18 degrees wide, or giving a total marking area of about one tenth of the 360 degree rotational angle of the shaft 30. Of course, if fewer harmonics are desired, the width of these stripes can be increased, and the coarse frequency input may be more approximate. Normally, for practical purposes, it is not anticipated that any frequencies above the tenth harmonic will be necessary.

It should also be understood that as far as the pick-up of the periodic sync pulses from the shaft 30 is concerned, it would not be necessary to utilize the multiple photocells and longitudinally offset patches, as three stripes circumferentially offset but all lying in a plane substantially perpendicular to the axis, and a single photocell pick-up could generate a phase detection sync signal that would satisfy the requirements of input information to the comparator 18. Further, while the invention has been illustrated as being utilized to synchronize the output of an oscillator with a variable rotating shaft, the circuitry of the invention could be utilized to synchronize the oscillator with any variable periodic input signal as long as it is possible to generate sync signals which can be compared with the square waveform output from the oscillator to determine whether the oscillator is leading or lagging the periodic function.

What is claimed is:

1. A circuit for synchronizing an oscillator with a variable periodic signal which includes an oscillator having a cyclic output, a circuit driven by the cyclic output of the oscillator to produce a periodic waveform, a comparator circuit to compare the waveform of the output of the oscillator to the waveform of the variable periodic signal to produce an electrical signal representing frequency and phase difference, the comparator circuit receiving an input from the variable periodic signal at least once per oscillator cycle and producing an error signal representing a phase leading or lagging of the cyclic output of the oscillator in terms of time, an oscillator control circuit driven by the error signal to supply feedback information to the oscillator to correct the output of the oscillator to achieve phase and frequency synchronization with the variable periodic signal, the oscillator control circuit having a short time constant integrator and a long time constant integrator with the error signal simultaneously fed to both integrators whereby the output of the short time constant integrator is proportional to the phase error between the oscillator output and the variable periodic signal, and the output of the long time constant integrator varies with the phase error averaged over a number of cycles and thus is proportional to frequency error, and means to sum the outputs of the integrators and to send the summations to the oscillator to correct simultaneously for frequency and phase error.

2. A circuit according to claim 1 where the oscillator is a voltage controlled oscillator and the error signal is a D.C. voltage as generated by the integrators.

3. A circuit according to claim 2 where the output of the oscillator is a square waveform, and which includes means to divide the periodic signal into a pair of square waveform pulses, where one pulse represents a predetermined time interval before and up to a reference with respect to the periodic signal and the other pulse represents the same predetermined time interval after the reference, whereby the comparator circuit receives both pulses, and the oscillator output as input signals, and determines during which pulse the leading edge of the square waveform from the oscillator output occurs, and the time interval during which there is coincidence of the respective pulse to the peak square wave portion of the oscillator output is measured to achieve a lead or lag signal to correct the phase of the square wave oscillator output.

4. A circuit according to claim 3 where the predetermined time interval is equal to about one-twentieth the time of the periodic signal in order that the oscillator frequency may be synchronized to harmonics of the periodic signal.

5. A circuit for synchronization of an oscillator to a variable periodic signal which includes an oscillator producing a cyclic square waveform, means to initially drive the oscillator to approximate the phase and frequency of the periodic signal, and means to compare the oscillator output to the periodic signal to determine an error signal representing the lead or lag thereof with respect to the cyclic square waveform, which circuit is characterized by an oscillator control circuit having a short time constant integrator and a long time constant integrator with the error signal simultaneously fed to both integrators, whereby the output of the short time constant integrator is proportional to the phase error between the oscillator output and the variable periodic signal, and the output of the long time constant integrator varies with the phase error averaged over a number of cycles and thus is proportional to frequency error, and means to sum the outputs of the integrators and send the summation to the oscillator to simultaneously correct frequency and phase error.

References Cited

UNITED STATES PATENTS 3,199,046 8/1965 Smeulers ---------- 331—27 X

FOREIGN PATENTS 899,935 6/1962 Great Britain.

ROY LAKE, Primary Examiner

SIEGFRIED H. GRIMM, Assistant Examiner

U.S. Cl. X.R.

331—17, 25, 172